United States Patent
Sun

(12) United States Patent (10) Patent No.: US 6,762,700 B2
Sun (45) Date of Patent: Jul. 13, 2004

(54) NEO METHOD AND SYSTEM FOR LOSSLESS COMPRESSION AND DECOMPRESSION

(76) Inventor: Jiannhwa Sun, 3741 Long Horn Ct., Richmond, CA (US) 94803

( * ) Notice: Subject to any disclaimer, the term of this patent is extended or adjusted under 35 U.S.C. 154(b) by 36 days.

(21) Appl. No.: 10/140,097

(22) Filed: May 7, 2002

(65) Prior Publication Data

US 2002/0196167 A1 Dec. 26, 2002

Related U.S. Application Data

(60) Provisional application No. 60/289,206, filed on May 7, 2001.

(51) Int. Cl.$^7$ ................................................ H03M 5/00

(52) U.S. Cl. ......................................................... 341/52

(58) Field of Search ............................. 341/52, 65, 50, 341/59, 63, 67, 87

(56) References Cited

U.S. PATENT DOCUMENTS 6,420,980 B1 * 7/2002 Ejima ........................... 341/51

* cited by examiner

*Primary Examiner*—Brian Young

(57) ABSTRACT

A method and system for compression and decompression are described. The compression method is based on the non-increasing encoding order (hereafter: NEO) method. The NEO method uses variable encoding lengths to encode a set of data items. It determines the encoding length of the current data item from the previous encoded data item. There are several variations which can enhance the compression performance of the NEO method. One uses a shorter encoding length with flag bit to achieve more efficient compression. Other modified methods try to reduce the range of encoding data values to get higher compression ratio. And there is a lossless compression system introduced by employing the NEO method. The system separates input data into blocks of data. For each data block, it separates the block into binary strings with equal size. The size of these strings is determined by the frequency of the LPS (less probable symbol) in this block. It then encodes the positions of the LPS of each string with the NEO method.

29 Claims, No Drawings

NEO METHOD AND SYSTEM FOR LOSSLESS COMPRESSION AND DECOMPRESSION

CROSS-REFERENCE TO RELATED APPLICATIONS

This nonprovisional application claims the benefit of the filing date of the provisional application, which was filed on May 7, 2001 with application Ser. No. 60/289,206.

BACKGROUND OF THE INVENTION

1. Field of the Invention

The invention relates to the field of lossless data compression and storage. In particular, the method and system of this invention improve the efficiency of communication as well as signal processing. The coding method of this invention is variable length coding method.

2. Description of the Related Art

Arithmetic coding is one of the most successful methods in this field. It offers a simple way to approach a good compression ratio. However, there are some drawbacks to using arithmetic coding. First, it takes several arithmetic operations to encode one single symbol. This leads to massive calculation while processing compression since the today's data generally contains millions of symbols. It is obvious that the compression will take longer if there are too many arithmetic operations—especially multiplications or divisions. Recently, much research focused on this problem recently. Some research has tried to reduce the number of operations without too much loss of compression performance. The other drawback to arithmetic coding is the floating point precision problem. After an long sequence floating point multiplications (or divisions), the result can only be expressed by a high precision floating point number. This demand really constrains some software and hardware design. Finally, if there is any error or loss during the process of compressing data by arithmetic coding, we can hardly recover the rest of the data. This is a really intractable but unavoidable situation when we transmit data via media.

There are many researchers focusing their efforts to solve these problems. However, it is not easy to balance these problems with high performance results due to the nature of arithmetic coding. Unlike the arithmetic coding method, this invention uses non-increasing order coding instead of interval coding. It introduces the non-increasing encoding order (hereafter: NEO) method to encode a set of data items in a non-increasing encoding length order to achieve a high compression ratio. Moreover, the major operations for this method are addition, bit-wise and comparison on integers. All of these operations are very efficient in software or hardware implementation. Also the compression system of this invention encodes input data block by block. It is highly appreciated in parallel processing and communication.

BRIEF SUMMARY OF THE INVENTION

The invention introduces the NEO method, which uses a non-increasing encoding length to encode a set of data values. Also it includes many variations to improve the performance of the NEO method. One modified method uses a shorter encoding length with a flag bit to achieve more efficient compression. Others focus on how to reduce the range of values of the sequence to reduce the encoding length. High compression performance is one advantage of the method. Low use of multiplications and divisions (avoiding them is possible) is another advantage of the method. Its major operations are addition, bit-wise and comparison on integers. Therefore, the run time for the compression or decompression is fast. Another contribution of the method is that it doesn't require floating point precision. That is, the NEO method can easily adapt to different platforms or devices. However, for variable length coding, it needs a method to delimit each encoded string. This is another aspect of this invention. The delimitation method employs both headers and end-of-string symbols to help the decoder avoiding any loss in the decoding stage.

Another object of this invention is to provide a lossless compression system which employs NEO method. The compression system separates input data into several blocks. For each data block, it separates the block into binary strings with equal size. The size of these strings is determined by the frequency of the LPS (less probable symbol) in this block. It then encodes the positions of the LPS of each string with the NEO method.

DETAILED DESCRIPTION OF THE INVENTION

The present invention offers a method with many variations to compress and decompress a set of data. Also it provides a system using this method to compress and decompress data. The compression method is called non-increasing encoding order (hereafter:NEO) method. Consider a non-increasing data values sequence $\alpha_1, \alpha_2, \ldots, \alpha_{n-1}, \alpha_n$ such that $\alpha_1 \geq \alpha_2 \geq \ldots \geq \alpha_{n-1} \geq \alpha_n$. When the most significant digit (hereafter:MSD) of $\alpha_1$ is at the P-th digit position and the MSD of $\alpha_2$ is at the Q-th digit position, then $P \geq Q$. From this observation, it can get $MSD_1 \geq MSD_2 \geq \ldots \geq MSD_{n-1} \geq MSD_n$ where $MSD_i$ is the digit position of the MSD of data value i. Therefore, when the encoding order is from the largest data value to the smallest, it is easy to predict a smaller encoding length (as opposed to a fixed encoding length) for the current data value from the previous encoded data value. That is, when the digit position of the MSD for the previous encoded data value is the M-th position, then the encoding length of the current data value is less than or equal to M digits when the least significant digit (hereafter:LSD) is at the first digit position of the previous data value. This is the main idea of NEO method—encoding a set of data values from the largest one to the smallest. At the same time, this idea can be used in any data type. Consider a set of data. When the minimum required encoding length (hereafter:MREL) of each data item is known, the set of data can be encoded from the data item with the longest MREL to the data item with the shortest MREL. In general, the MREL of a data item is the length between the MSD and the LSD when it makes the data item as a data value. That is, the NEO method can be rewritten as encoding a set of data from the data item with the longest MREL to the data item with the shortest MREL. In a preferred embodiment, for encoding a set of data items, the encoding length of the current data item is the same as the MREL for the previous encoded data item. However, for encoding the first data item (the data item with the longest MREL), its encoding length could be the longest allowable encoding length of data item in the set.

An example for encoding decimal numbers by NEO method is as follows: Given a set of numbers 12, 3, 101, 1080, 3, 1080 and 120, and the longest given allowable number in this example is 5 digits (99999). For the NEO method, the encoding order is from the largest one to the smallest. It thus encodes these numbers by the order—1080, 1080, 120, 101, 12, 3, 3. Since the maximum (longest) allowable number is 5 digits long, it encodes the first number (1080) with 5 digits long. The MSD of the first number is the 4-th position. Therefore, the encoding length for the second number is 4 digits. It continues this process until the smallest number. All encoding steps are in Table 1.

The encoded sequence is 010801080012010101012033. Fixed length encoding would need to encode 35 (7×5) digits.

With NEO method, it only takes 22 digits to encode these 7 numbers. However, NEO method encodes these numbers without their original positions in this embodiment. In alternate embodiments, it appends the original order information with the encoded sequence, making it possible recover these numbers with their original positions. In the decoding stage, it is only necessary to know the encoding length for the first number of the encoded sequence. The first number is decoded by taking from the beginning of the encoded sequence a

TABLE 1

| Number to be encoded | Encoding length (= the length of the previous number from its MSD to its LSD) | Encoded digits | Digit position of the MSD |
|---|---|---|---|
| 1080 | 5 digits (maximum allowable length) | 01080 | 4-th |
| 1080 | 4 digits | 1080 | 4-th |
| 120 | 4 digits | 0120 | 3-rd |
| 101 | 3 digits | 101 | 3-rd |
| 12 | 3 digits | 012 | 2-nd |
| 3 | 2 digits | 03 | 1-st |
| 3 | 1 digit | 3 | 1-st | string of digits of length equal to he encoding length for the first number. For the rest of the encoded sequence, at each step it takes a string of length equal to the MREL of the previous decoded number. The decoding steps are shown in Table 2.

In the case of binary data compression, there is another NEO method guaranteed to have equal or better compression performance that the above NEO method. It uses a shorter encoding length (one bit less that the above method) to encode each binary data value, appending a flag bit when necessary. Consider two binary data items A and B such that the value of A≧the value of B, and let the binary expression of A be $\alpha_n \alpha_{n-1} \ldots \alpha_{m+2} \alpha_{m+1} \alpha_m \ldots \alpha_1, \alpha_{m+1}(=1)$ is the most significant bit 1 (hereafter:MSB1) of A. Thus, when the least significant bit (hereafter:LSB) is $\alpha_1$, $\alpha_i$ is 0 when $n \leq i \leq m+2$ and $\alpha_i$ is 1 or 0 when $m \leq i \leq 1$. The sub-string of a bit string from the MSB1 to the LSB is called NEO-bit-string. That is, the NEO-bit-string of A is $\alpha_{m+1}\alpha_m \ldots \alpha_2\alpha_1$. There is a exception when the value of A is 0 (a string of all 0 bits), the NEO-bit-string of A is the bit 0. Also it it true that the NEO-bit-string of a string is the same as the binary value of bit string. Thus, the NEO-bit-string of A is the same as the binary value of A. Another sub-string is called the NEO-trim-bit-string when it is the NEO-bit-string without its MSB1. There is not NEO-trim-bit-string when the bit

TABLE 2

| Sequence to be decoded | Decoding length (= the length of the previous decoded number from its MSD to its LSD) | Decoded number | Digit position of the MSD in the decoded number |
|---|---|---|---|
| 01080 10800120101012 033 | 5 digits (maximum allowable length) | 1080 | 4-th |
| 1080 0120101012033 | 4 digits | 1080 | 4-th |
| 0120 101012033 | 4 digits | 120 | 3-rd |
| 101 012033 | 3 digits | 101 | 3-rd |
| 012 033 | 3 digits | 12 | 2-nd |
| 03 3 | 2 digits | 3 | 1-st |
| 3 | 1 digit | 3 | 1-st | string is 1 bit long. The NEO-trim-bit-string of A is $\alpha_m \ldots \alpha_2\alpha_1$. Unlike the first NEO method, it uses m bits (not m+1 bits) to encode B (there is an exception when the value of A is 1 or 0, it uses 1 bit to encode B). In a preferred embodiment, when the position of the MSB1 of B is less than the position of the MSB1 of A, there is no problem encoding B with length m bits. When the position of the MSB1 of B is equal to the position of the MSB1 of A (both data values are m+1 bits long), it only encodes the last m bits of B (that is, it encodes the value of B without its MSB1). Therefore, no matter what the value of B is, the encoding length is always m bits long. The next step will add a flag bit when it is necessary for decoding purposes. When the value of the string of m bits encoding B is larger than the value of the NEO-trim-bit-string of A, this m bits string must contain B without any loss. However, when the value of the string of m bits encoding B is less than or equal to the value of the NEO-trim-bit-string of A, this m bits string may not contain the MSB1 of B. Under this condition, the method encodes a flag bit at the end of the m bits string to indicate whether this string is lacking of the MSB1 of B or not. There is an exception when the value of A is 1 or 0 (1 bit long), it uses 1 bit (not 0 bits) to encode B. It thus doesn't need a flag bit since B is a data value with 1 bit long.

Here is an example showing the method of NEO with a flag bit. Given a set of 6-bit-long binary data items 010010, 000010, 000111, 000001 and 000010, and let the LSB is the rightmost bit. Thus, the values of these items are 10010, 10, 111, 1, 10 and 100001. The encoding order for these data values is 100001, 10010, 111, 10, 10, 1. The maximum allowable data value is 6 bits (111111) in this example. It then encodes the first data value (100001) with 6 bits long. Since the most significant bit (hereafter:MSB) of the first data value is at the 6-th bit position, the encoding length for the second data value is 5 (=6−1) bits long. The encoding length is equal to the length of the NEO-trim-bit-string of the first data value. It encodes the second number (10010) without any loss. The next step is to compare the encoded string (10010) with the NEO-trim-bit-string of the first data value (00001). Since the value of the encoding string is larger, it doesn't need to encode a flag bit. The steps of encoding these data values are shown in Table 3.

As a result, it uses 21 bits 100001100100111100110 to encode these 7 binary data values. For decoding this sequence, the procedure is the same as the decoding procedure of the first NEO method except that the decoding length is 1 bit less. Also it needs a comparison to determine whether it needs to read one more flag bit or not. The decoding steps are shown in Table 4.

Could the above two NEO methods be improved more? There are two ways which use subtraction methods to enhance the compression performance of the above two NEO methods. Consider a strictly increasing data value sequence $\alpha_0, \alpha_1, \alpha_2, \ldots, \alpha_{n-1}, \alpha_n$ such that $\alpha_0 < \alpha_1 < \alpha_2 < \ldots < \alpha_{n-1} < \alpha_n$.

It can get $\alpha_0 \leq \alpha_1 - 1 < \alpha_2 - 1 < \ldots < \alpha_{n-1} - 1 < \alpha_n - 1$
→$\alpha_0 \leq \alpha_1 - 1 \leq \alpha_2 - 2 < \ldots < \alpha_{n-1} - 2 < \alpha_n - 2$
. . .
→$\alpha_0 \leq \alpha_1 - 1 \leq \alpha_2 - 2 \leq \ldots \leq \alpha_{n-1} - (n-1) < \alpha_n - (n-1)$
→$\alpha_0 \leq \alpha_1 - 1 \leq \alpha_2 - 2 \leq \ldots \leq \alpha_{n-1} - (n-1) \leq \alpha_n - n$
Now, it becomes a non-increasing sequence $\alpha_n - n, \alpha_{n-1} - (n-1), \ldots, \alpha_2 -$

TABLE 3

| Data value to be encoded | NEO-trim-bit-string of the previous data value | Encoded string (= the length of the NEO-trim-bit-string of the previous data value) | Flag bit (required only when the value of the encoded string ≦ the value of the NEO-trim-bit-string of the previous data value) |
|---|---|---|---|
| 100001 | No (since this is the first data value) | 100001 (6 bits = the maximum allowable length) | No (since it is the first data value) |
| 10010 | 00001 | 10010 (5 bits) | No (10010 > 00001) |
| 111 | 0010 | 0111 (4 bits) | No (0111 > 0010) |
| 10 | 11 | 10 (2 bits) | Yes (10 ≦ 11). The flag bit is 0 since the encoded string contains the whole data value. |
| 10 | 0 | 0 (1 bit) | Yes (0 ≦ 0). The flag bit is 1 since the encoded string (0) lacks the MSB of the data value (10). |
| 1 | 0 | 1 (1 bit) | No (1 > 0) |
| 0 | None (since the previous data value is one bit long) | 0 (1 bit) | No (since the current data value is 1 bit long) |

TABLE 4

| Sequence to be decoded | NEO-trim-bit-string of the previous decoded value | Decoded string (= the length of the NEO-trim-bit-string of the previous decoded value) | Flag bit (existed only when the value of the decoded string ≦ the value of the NEO-trim-bit-string of the previous decoded value | Decoded value |
|---|---|---|---|---|
| 100001 10010011 11000110 | No (since it is the first value) | 100001 (6 bits = the maximum allowable length) | No (since it is the first decoded value) | 100001 |
| 10010 01111 000110 | 00001 | 10010 (5 bits) | No (10010 > 00001) | 10010 |
| 0111 1000110 | 0010 | 0111 (4 bits) | No (0111 > 0010) | 111 |
| 10 00110 | 11 | 10 (2 bits) | Yes (10 ≦ 11). Because the flag bit (the next undecoded bit) is 0, the decoded string contains the whole data value | 10 |
| 0110 | 0 | 0 (1 bit) | Yes (0 ≦ 0), Because the flag bit (the next undecoded bit) is 1, add bit 1 to the left side of the MSB of the decoded string to be the decoded value. | 10 |
| 10 0 | 0 | 1 (1 bit) | No(1 > 0) | 1 |
| | None (since the previous value is 1 bit long) | 0 (1 bit) | No (since the current value is 1 bit long | 0 |

2, $\alpha_1-1$, $\alpha_0$ and it still can be encoded by NEO method. Since each data value (except the smallest one) is reduced by this incremental subtrahend method, it does make more efficient compression. But this method can be only used in the case of strictly increasing data value sequences. The other subtraction method reduces each data value by a fixed subtrahend. In a preferred embodiment, it combines both subtraction methods with any NEO method when the encoding data values are distinct. In an alternate preferred embodiment, it uses the fixed subtrahend method when the encoding data values are not distinct. Here is an example showing the subtraction method. For a set of distinct data values 9, 23, 22, 18, 12, and 20, it subtracts the smallest data value (9) from each data value and gets a set of distinct reduced data values 0, 14, 13, 9, 3, and 11. The fixed subtrahend method is used in this step. The next step rearranges these reduced data values into an increasing sequence 0, 3, 9, 11, 13 and 14. Now using the incremental subtrahend method, the sequence becomes 0–0, 3–1, 9–2, 11–3, 13–4, 14–5. That is, the new reduced sequence is the non-decreasing sequence 0, 2, 7, 8, 9 and 9. The final step encodes the fixed subtrahend (9) and this reduced data value sequence by NEO method or any method which can compress a set of data values. All of the above mentioned NEO methods may further be improved by encoding differences of adjacent data values instead of encoding data values.

The other important issue for a variable length coding method is the end-of-string problem. There is no such problem if it encodes only one set of data. However, for encoding sets of data with different lengths, after encoding each set of data into different string, the decoder needs some "hint" to delimit each encoded string. But it is not necessary to be concerned with the end-of-string problem when the number of (data) items in every set is known in advance. There are two methods that could resolve this problem. Adding a header at the beginning of each encoded string is a good way to tell decoder the size of the string. Another method is putting an end-of-string symbol at the end of each encoded string to separate two adjacent encoded strings. A preferred embodiment combines these two methods. A header in each string indicates the number of encoded items in this string or a range of the number of encoded items in this string. When a header shows the precise amount of encoded items, it doesn't need the end-of-string symbol. However, when a header only indicates a range of the number of encoded items in a string, it does need an end-of-string symbol put at the end of each encoding string.

For example, 00 indicates no item in a string, 01 indicates one item in a string, 10 indicates two items in a string, and 11 indicates three or three more items in a string. It doesn't need an end-of-string symbol except that the header of the string is 11. When it uses the NEO method with subtrahend, the end-of-string symbol could be any number except 0 since the last reduced data value must be 0. When decoder finds that the current decoded data value is not 0 but its previous decoded data value is 0, it knows the current decoded data value is the end-of-string symbol. It always selects number 1 to be the end-of-string symbol.

All of the above mentioned methods pertain to compressing a set of data. That is, these compression methods only encode a set of data ignoring any order relations among these data. How to adapt these methods to compress sequence(s) of data to become a general purpose compression system? There is a compression system introduced by using these NEO methods.

The system is to add information of the original position of each data item in the data sequence to help the decoder to recover the data sequence without any loss. In a preferred embodiment, it separates the input data into plural blocks of data with fixed size, with the possible exception of the last block, which may be smaller. For each block, it encodes a flag bit to indicate whether the block is the last one or not. When the block is the last one, size of the block needs to be encoded after the flag bit. The second step divides the block of data into sequences of equal numbers of equal sized data items. For each data sequence, it encodes the information of the original position of each data item by the order of data items encoded in the next step, then encodes these data items by the NEO method or any method of compressing a set of data. Due to the equal number of data items, there is no end-of-string problem among these sequences in the compression system.

In an alternate preferred embodiment, there is another way to encode these blocks of data without encoding the the original position of each data item in the data sequence. The first step is converting the data into binary representations when it is not expressed in the binary number system. For each block data, after counting the occurrences of two symbols (bit 1 and bit 0) in a block, the frequency of the LPS (the symbol with fewer occurrences) can be determined. The frequency F=(the occurrences of the LPS in the block/the size of the block). Then it separates the block data into binary strings with equal size S where S is the closest dyadic integer to 1/F (since it is more efficient when the string size is dyadic). For example, if 1/F is 17.8, the S will be 16 (=$2^4$) bits. The string size S and the symbol of the LPS are encoded by encoder. When F is 0 (the occurrences of the LPS in the block is 0), the block won't be encoded since all bits in this data are the same. It encodes S as 0 to tell decoder that the data contains no LPS. The next step is converting the positions of the LPS of each string into a set of distinct non-increasing data values. For example, if the binary string is 0100000010100000, the distinct non-increasing data values are 14, 7 and 5 when the LPS is bit 1 and the LSB is on the rightmost side of the string. After it gets sets of distinct non-increasing data values, the encoder encodes these sets of data values by the mentioned NEO method. Also it needs to encode a header and/or the end-of-string symbol in order to tell decoder when to stop decoding a set of data values. In decoding stage, after decoding the positions of the LPS of a binary string, decoder can easily recover the binary string.

I claim:

1. A method of encoding a set of data values, the method comprising the steps of:
   predetermining the position of the least significant digit of each data value in its encoding string;
   encoding the largest data value with a predetermined length; and
   for the rest of the data values, encoding each data value from the largest one to the smallest, the encoding length of each data value being calculated from the previous encoded data value.

2. The method of claim 1 wherein the position of the least significant digit is the rightmost digit or the leftmost digit in a encoding string.

3. The method of claim 1 wherein the method of encoding the largest data value of the set is applied to only one occurrence of the largest data value, whether the occurrence of the largest data value is plural or not.

4. The method of claim 1 wherein the predetermined encoding length for encoding the largest data value is taken as the minimum length required to encode the maximum allowable data value in the set.

5. The method of claim 1 wherein encoding each of the rest of the data values from the largest one to the smallest is done by taking the encoding length of each data value to be the same as the length of the previous encoded data value from its most significant digit to the least significant digit.

6. A method of decoding a set of data values in accordance with claim 1, the method comprising the steps of:
   decoding the first data value by taking a string with length equal to the predetermined length of encoding the largest data value;
   for the rest of the encoded data values, at each step, decoding the current data value by taking a string with length equal to the length of the previous decoded data value from its most significant digit to its least significant digit.

7. A method of encoding a set of data items, the method comprising the steps of:
   predetermining an invertible converting system to convert each data item into a binary data value when the data item is not represented in the binary number system;
   predetermining the position of the least significant bit of each data value in its encoding bit string;
   encoding the largest data value of the set with a predetermined encoding length;
   for the rest of the data values, encoding each data value from the largest one to the smallest, the encoding length of each data value calculated from the previous encoded data value.

8. The method of claim 7 wherein the method of the position of the least significant bit of each data value is the rightmost bit or the leftmost bit in its encoding bit string.

9. The method of claim 7 wherein the method of encoding the largest data value of the sequence is applied to only one occurrence of the largest data value, whether the occurrence of the largest data value is plural or not.

10. The method of claim 7 wherein the predetermined encoding length for encoding the first encoded data value is taken as the minimum bit(s) required to encode the maximum allowable data value in the set.

11. The method of claim 7 wherein encoding each of the rest of the data values from the largest one to the smallest is done by encoding each current data value with length one bit less than the previous data value from its most significant bit to its least significant.

12. The method of claim 11 including the step of when the previous data value is 1 or 0, the encoding length of the current data value is one bit.

13. The method of claim 11 including the step of when the position of the most significant bit of the current data value is the same as the position of the most significant bit of the previous data value, encoding the current data value without its most significant bit.

14. The method of claim 7 including the step of when the value of the previous data value without its significant bit is greater than or equal to the value of the encoded string for the current data value, encoding a flag bit which indicates whether or not the position of the most significant bit of the current data value is the same as that of the previous data value.

15. The method of claim 14 including the step of when the previous data value is 1 or 0, the encoded string of the current data value is the same as the current data value without any flag bit.

16. A method of decoding a set of data items in accordance with claim 7, the method comprising the steps of:
   decoding the first data value by taking a bit string with length equal to the length of encoding the maximum allowable data value;
   for decoding each of the rest of the encoded data values,
   when the previous data value is 1 or 0, the current value is decoded by reading the next bit;
   when the previous data value is not 1 nor 0, taking a string of bits with length one bit less than the previous decoded data value, and comparing the value of all but the most significant bit of the previous decoded data value with the value of the bit string; and
      when the comparison result is that the value of the previous decoded data value without its significant bit is less than the value of the current bit string, the current data value is the same as the value of the bit string;
      when the comparison result is that the value of the previous decoded data value without its significant bit is greater than or equal to the value of the current bit string, taking the next bit after the end of the current bit string to be the flag bit, and
         when the flag bit indicates the position of the most significant bit of the current data value is the same as that of the previous data value, the current data value is the value of the bit string composed of the current bit string with an additional bit 1 appended to its most significant end to become the new most significant bit;
         when the flag bit indicates the position of the most significant bit of the current data value is not the same as that of the previous data value, the current data value is the same as the value of the current bit string;
   converting each data value into the original data item via the invertible converting system in accordance with claim 7.

17. A method of encoding a sequence of data items, the method comprising the steps of:
   predetermining an invertible converting system to convert the sequence of data items into a sequence of data values;
   sorting the sequence of data values into a sequence of non-increasing data values;
   encoding in a predetermined format the information of the position in the original sequence of each data value in the sorted sequence;
   encoding each data value from the largest one to the smallest.

18. A method of decoding a sequence of data items in accordance with the method of claim 17, the method comprising the steps of:
   decoding the information of the position in the original sequence of each encoded data value by the predetermined format;
   decoding each encoded data value from the largest one to the smallest;
   restoring the original order of data values in the sequence using the position information which has been decoded from the predetermined format;
   converting the sequence of data values into a sequence of data items via the invertible converting system as in claim 17.

19. A method of encoding a set of distinct data values, the method comprising the steps of:
   setting the deduction number of each data value in the set; and
   deducting the set deduction number from each data value in the set;
   encoding each deducted data value from the largest one to the smallest.

20. The method of claim 19 wherein the setting step assigns the deduction number of the smallest data value equal to zero, the deduction number of the second smallest data value equal to one, the deduction number of the third smallest data value equal to two . . . , the deduction number of the N-th smallest data value equal to N−1.

21. A method of decoding a set of distinct data values in accordance with claim 19, the method comprising the steps of:
   decoding each deducted data value from the largest one to the smallest;
   adding to each deducted data value the deduction number to return to the original data value.

22. The method of claim 21 wherein the step adds the deduction number to get the original data value, the deduction number of the last deducted data value equal to zero, the deduction number of the second last data value equal to one, the deduction number of the third last data value equal to two . . . , the deduction number of the N-th last data value equal to N−1.

23. A method of encoding sets of data values, the method comprising the steps of:
   defining a table of headers for indicating an explicit count of data values in a set or a range of counts of data values in a set;
   defining an end-of-string symbol which can indicate the end of encoded string;
   for each set of data values,
      when the count of the data values is unknown in advance, encoding a header which corresponds to the count of data values in the set;
      encoding each data value from the largest one to the smallest;
      encoding an end-of-string symbol after the end of encoded data values when the header doesn't indicate the explicit count of data values in the set.

24. A method of decoding sets of data in accordance with the method of claim 23, the method comprising the steps of:
   for decoding each set of encoded data values,
      decoding the header to get the count of encoded data values in the set or the range of counts of encoded data values in the set;
      decoding each encoded data value from the largest one;
      when the header indicates the explicit count of data values in the set, stopping decoding the set and proceeding to decode the next set when the count of decoded data values equals the count indicated by the header;
      when the header doesn't indicate the explicit count of data values in the set, stopping decoding the set and proceeding to decode the next set when the end-of-string symbol is encountered.

25. A method of encoding a binary data string, the method comprising the steps of:
- when the size of the string is unknown in advance, encoding a header which indicates the size of the string;
- when the less probable symbol is unknown in advance, encoding a flag bit which indicates the less probable symbol of the string;
- encoding each position of the less probable symbol from the largest one to the smallest.

26. A method of decoding a binary data string in accordance with the method of claim 25, the method comprising the steps of:
- when the size of the string is unknown in advance, decoding a header which indicates the size of the string;
- decoding a flag bit which indicates the less probable symbol of the string;
- decoding each encoded position of the less probable symbol from the largest one to the smallest;
- converting the positions of the less probable symbol to restore this string.

27. A method of encoding data with headers for block size, less probable symbol, and string size, whose formats are known in advance, the method comprising the steps of:
- converting the data into binary representations when it is not expressed in the binary number system;
- separating the data into one or several block(s) of binary data. Possibly excepting the last block, the size of each block is equal;
- encoding a block-size header which indicates the block-size;
- for encoding each block data,
- separating the block data into binary strings with equal size;
- encoding a string-size header which indicates the string-size;
- encoding a flag bit which indicates whether the block is the last block, and when the block is the last one, also encoding a header which indicates size of the last block;
- encoding a flag bit which indicates the less probable symbol;
- stopping encoding this block and proceeding to encode the next block when the occurrences of the less probable symbol in the block is 0;
- converting the positions of the less probable symbol of each string into a set of distinct data values;
- encoding each set of distinct data values.

28. The method of claim 27 wherein the step separates the block data into binary strings with equal size S where S is the closest dyadic integer to 1/F, F is the frequency of the less probable symbol in the block (F=the occurrences of the less probable symbol in the block/the size of block), when F is 0 (the occurrences of the less probable symbol in the block is 0), the string-size S will be encoded as 0 and the block won't be encoded.

29. A method of decoding data in accordance with the method of claim 27, the method comprising the steps of:
- decoding the block-size header;
- for each block of encoded binary data,
- decoding the string-size header which indicates the size of strings in the block;
- decoding the flag bit, and when the flag bit indicates this block is the last block, decoding the block-size header to get the size of the last block;
- reading the next flag bit which indicates the less probable symbol;
- when string-size is 0, so that the whole block contains no less probable symbol, writing the more probable symbol with the block size and proceeding to decode the next block of data;
- when string-size is not 0, dividing block size by string size to get the number of encoded strings in the block;
- converting each set of decoded data values into the positions of the less probable symbol in each string to get the decoded binary data;
- restoring the decoded binary data into the original data format when necessary.

* * * * *